United States Patent
Okuda

(10) Patent No.: US 6,805,338 B1
(45) Date of Patent: Oct. 19, 2004

(54) SEMICONDUCTOR WAFER CHUCK ASSEMBLY FOR A SEMICONDUCTOR PROCESSING DEVICE

(75) Inventor: Masakazu Okuda, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/461,255

(22) Filed: Jun. 13, 2003

(51) Int. Cl.$^7$ ................................................ B25B 11/00
(52) U.S. Cl. ........................................ 269/21; 269/296
(58) Field of Search ............................. 29/559; 269/21, 269/13, 296, 309, 310; 361/234, 233; 451/388

(56) References Cited

U.S. PATENT DOCUMENTS 4,213,698 A * 7/1980 Firtion et al. ................. 269/21
6,305,677 B1 * 10/2001 Lenz ............................ 269/21

* cited by examiner

Primary Examiner—Robert C. Watson
(74) Attorney, Agent, or Firm—Maginot, Moore & Beck LLC

(57) ABSTRACT

A wafer chuck assembly for a semiconductor wafer processing device has axially movable wafer support pins associated with a wafer chuck body of the wafer chuck assembly. The wafer support pins are biased to contact and support the backside of a semiconductor wafer when the semiconductor wafer is placed and/or maintained (typically via air suction) on the wafer chuck assembly. Each support pin axially moves independent of one another such that any area of contamination on the backside of the semiconductor wafer that registers with a support pin, moves the affected support pin axially downwardly.

6 Claims, 3 Drawing Sheets

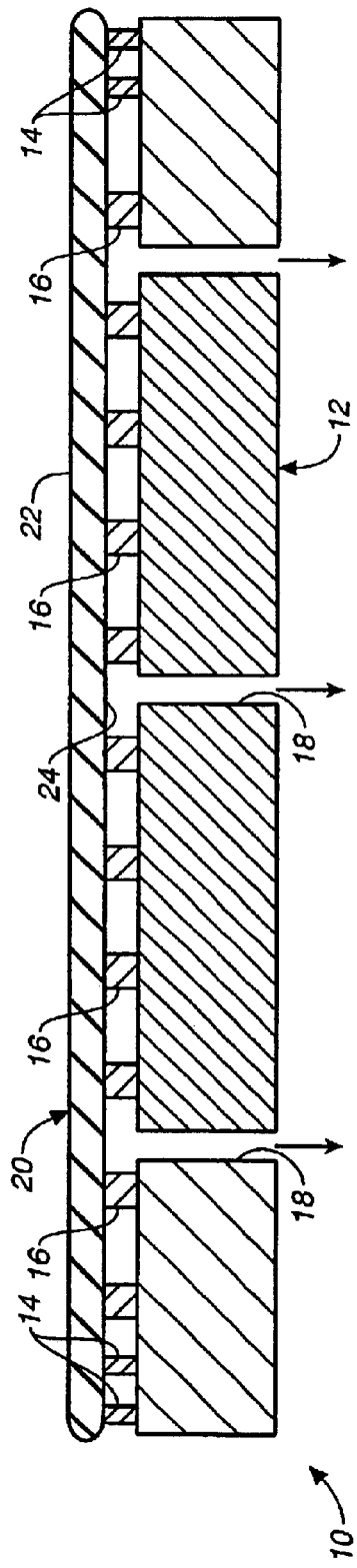
FIG._1 (PRIOR ART)
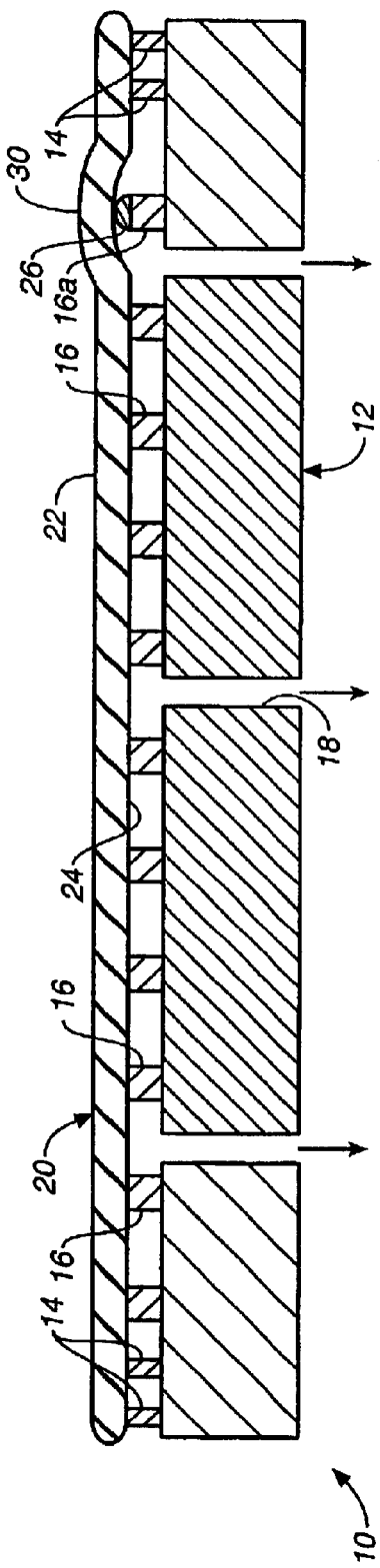
FIG._2 (PRIOR ART)

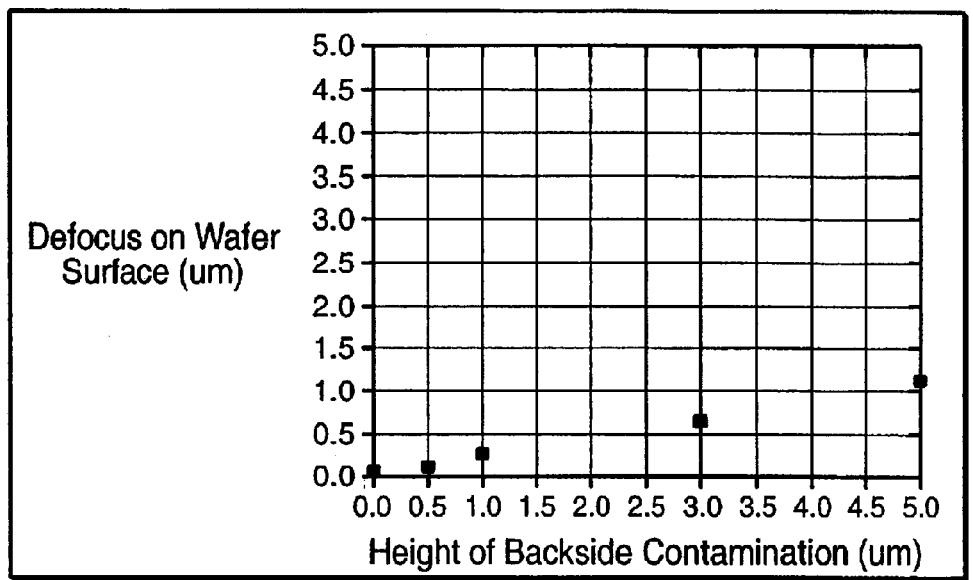
FIG._3
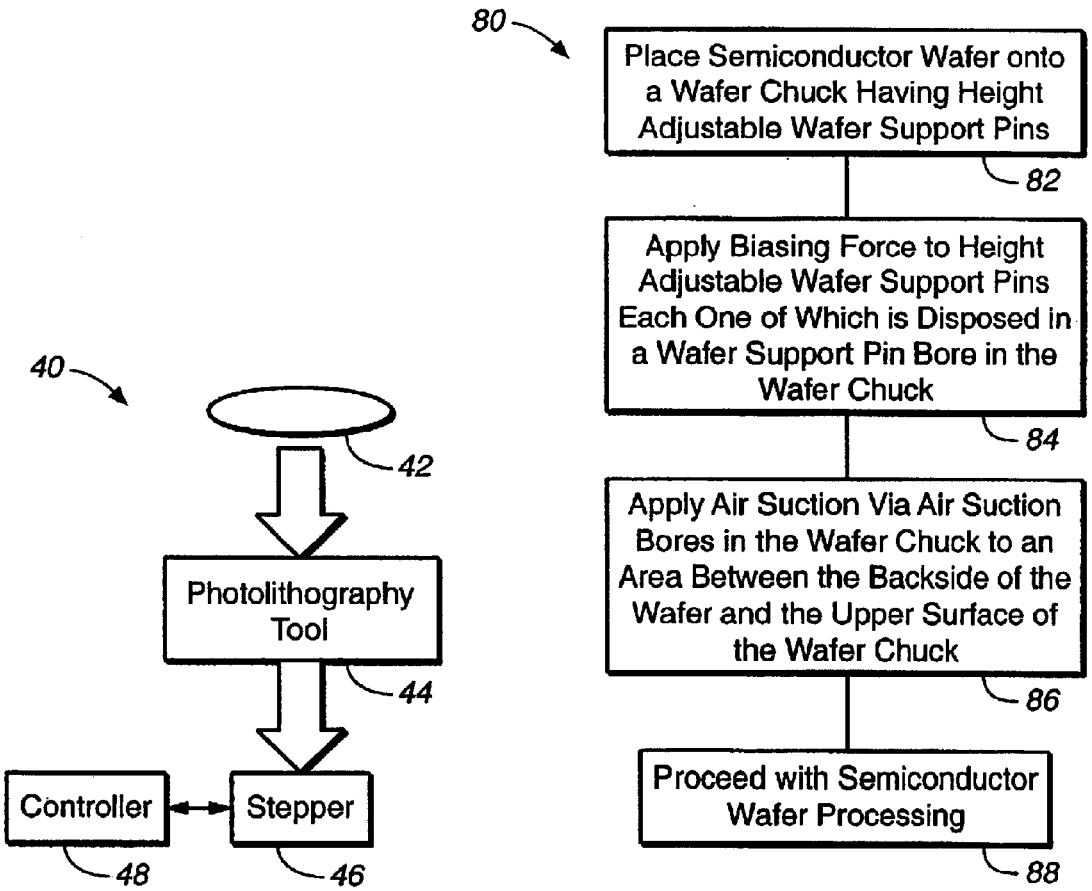
FIG._4
FIG._7

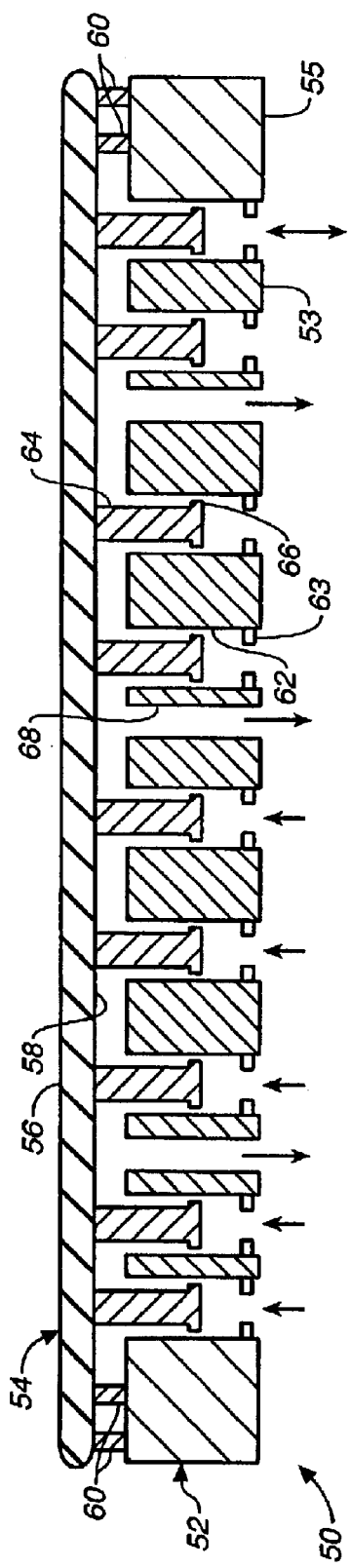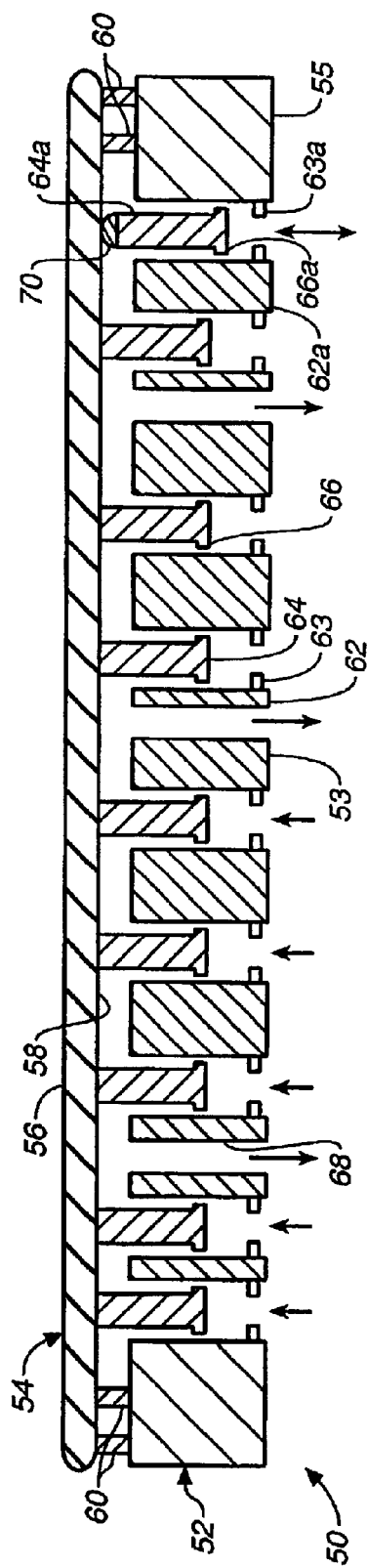

SEMICONDUCTOR WAFER CHUCK ASSEMBLY FOR A SEMICONDUCTOR PROCESSING DEVICE

BACKGROUND

1. Field of the Invention

The subject invention relates generally to processing systems for semiconductor technology and, more specifically, to a semiconductor wafer processing chuck for semiconductor wafer processing tools.

2. Background Information

Semiconductor devices such as integrated circuits (ICs) form at least part of almost every electronic product. As semiconductor technology advances, the complexity of integrated circuits increases. This increased complexity typically results in smaller integrated circuit elements and/or components. Because of the decrease in size of the circuit elements, the techniques for producing the circuit elements, and thus the integrated circuit itself, need to be quite precise. Problems in wafer processing or defects introduced during such wafer processing can result in bad or defective integrated circuits.

The many semiconductor processing steps utilize various semiconductor processing tools. Such processing tools include deposition devices of many types, photolithography devices, polishing devices and/or the like. Most, if not all, of these devices utilize what is known as a wafer chuck mechanism to hold the semiconductor wafer for processing. In FIG. 1, a typical (prior art) wafer chuck mechanism 10 is shown. The wafer chuck mechanism 10 of FIG. 1 is depicted in cross-section for clarity.

The wafer chuck mechanism 10 includes a wafer chuck 12. The wafer chuck 12 is typically annular in shape to conform to the generally annular shape of semiconductor wafers. The wafer chuck 10 has a shield ring 14 that is disposed on an outer annular periphery of the upper surface thereof. A plurality of wafer pins 16 fixedly extend axially upward from an upper surface of the wafer chuck 12. The wafer pins 16 are adapted to support a semiconductor wafer 20 above the surface of the wafer chuck. Particularly, the top of the wafer pins 16 contact a lower or bottom surface (backside) 24 of the semiconductor wafer 20 to hold the semiconductor wafer 20 flat. Processing is performed on the top or upper surface 22 of the semiconductor wafer 20.

It should be appreciated that the wafer pins 16 are enlarged for clarity. Typically, wafer pins have a dimension on the order of 0.07065 mm$^2$. A typical wafer chuck has approximately 5827 pins. Additionally, the wafer chuck has other parts that can contact the backside of the semiconductor wafer. These other parts have an approximate area of 583.54 mm$^2$. Thus, approximately 5.4% of the backside area of the semiconductor wafer is in contact with components of the wafer chuck.

The wafer chuck mechanism 10 utilizes suction (i.e. a vacuum or exhaustion of air) in order to retain the semiconductor wafer 20 onto the wafer pins 16 of the wafer chuck 12 for processing. As shown in FIG. 1, the wafer chuck 12 includes a plurality of suction or air exhaustion ports or bores 18. A suction, vacuum or air exhaustion device (not shown) is in communication with the ports 18. The air suction (represented by the arrows emanating from the bores 18) pulls the semiconductor wafer 20 onto the wafer pins 16. The vacuum or suction force is maintained during wafer processing. This aids in securely retaining the semiconductor wafer 20 onto the wafer chuck mechanism 10.

For various reasons, certain areas of the backside of the semiconductor wafer may become contaminated during one or more of the various processing steps (not including solvent and scrubber cleaning steps). Particularly, various areas of the backside of the semiconductor wafer may have particle contamination after one or more wafer processing steps. For example, after chemical vapor deposition (CVD) the backside of the semiconductor wafer may have as many as 5000 particles of contamination scattered thereabout ranging in size from about 2.9 $\mu$m and smaller. Likewise, after sputtering, the backside of the semiconductor wafer may have as many as 1100 particles of contamination scattered thereabout ranging in size from about 2.9 $\mu$m and smaller. Additionally, after resist coating, the backside of the semiconductor wafer may have as many as 1400 particles of contamination scattered thereabout ranging in size from about 2.9 $\mu$m and smaller.

Such contamination may lead to or cause defects in wafer processing. One such defect that can occur during photolithography processing of the semiconductor wafer is known as "hot spot." Hot spot is induced by wafer backside contamination resulting from previous wafer processing. If the contamination on the wafer backside happens to register with one of the pins 18 of the wafer chuck 12, defocusing during the photolithography process may occur around a small region of the wafer surface opposite the contamination.

Referring to FIG. 2, the problem of hot spot is graphically illustrated. In FIG. 2, a particle of contamination 26 on the backside 24 of the semiconductor wafer 20 is shown registered with (on top of) wafer pin 16a. The suction pulling down on the backside 24 of the wafer 20 causes a deformity 30 to occur in the wafer 20. The deformity 30 creates a bump, bulge or the like on or to the upper or topside surface 22 of the semiconductor wafer 20. Thus, rather than the upper surface 22 being generally planar, the upper surface 22 now has a topology. It should be appreciated that FIG. 2 shows only one hot spot, but there may be many more on the wafer.

FIG. 3 is a graph 34 illustrating how backside contamination can affect photolithography processing of the semiconductor wafer. Particularly, the graph 34 of FIG. 3 correlates the height of backside contamination (in $\mu$m) along the x-axis to the defocus on the wafer surface (in $\mu$m) along the y-axis caused by the contamination. As can be seen from the five plotted points, the greater the height of the backside contamination, the greater the defocus. Such correlation, however, is not linear.

Such defocusing due to hot spot can induce incomplete patterns for the formation of integrated circuit components, like short metal lines, broken metal lines, unlanded vias, and unlanded contact holes. Periodic visual inspection for production wafers has heretofore been done utilizing an ultraviolet light visual inspection tool. The affected wafer will exhibit refraction and diffraction anomalies at the hot spot region. Visual inspection for hot spot may also be accomplished on every production wafer after the mask process. Because, production wafers typically have several previously printed mask patterns, it is difficult to visually detect hot spot.

In view of the above it should be appreciated that it is thus very difficult to visually and/or periodically detect hot spot in all cases. Moreover, it is difficult to reduce or eliminate backside contamination during the various processing steps.

What is therefore needed in view of the above, is a system, method and/or apparatus for alleviating semiconductor wafer production problems associated with hot spot.

SUMMARY

The above needs are addressed by a system, apparatus and/or method that compensates for semiconductor backside contamination during processing of the semiconductor wafer. Particularly, the subject invention is a wafer chuck assembly that compensates for backside contamination on a semiconductor wafer during photolithography processing of the semiconductor wafer.

In one form, the subject invention provides a method of retaining a semiconductor wafer for processing. The method includes the steps of: (a) placing a semiconductor wafer onto a wafer chuck having height adjustable wafer support pins and a shield ring; (b) applying a biasing force to each wafer support pin; and (c) applying suction to a backside of the semiconductor wafer.

In another form, the subject invention is a wafer chuck assembly. The wafer chuck assembly includes a wafer chuck, a suction bore in the wafer chuck and adapted to be connected to an air suction device, a plurality of pin bores in the wafer chuck, and a support pin axially movably disposed in each one of the plurality of pin bores.

In yet another form, the subject invention is a wafer chuck assembly for a semiconductor wafer processing device. The wafer chuck assembly includes a wafer chuck body having an upper surface and a lower surface, a shield ring disposed on the upper surface of the wafer chuck body, means for providing suction to the upper surface of the wafer chuck body, and support means disposed in the upper surface of the wafer chuck body for receiving a backside contaminated semiconductor wafer for processing and providing a relatively planar processing surface for the backside contaminated semiconductor wafer.

The subject invention provides the ability to compensate for semiconductor wafer backside contamination, particularly areas of which register with wafer support pins, that aids in alleviating hot spot during wafer processing. This provides a relatively planar upper or processing surface for processing.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 1 is an enlarged cross-sectional view of a prior art semiconductor wafer chuck holding a non-contaminated semiconductor wafer;

FIG. 2 is an enlarged cross-sectional view of a prior art semiconductor wafer chuck holding a backside contaminated semiconductor wafer particularly depicting wafer deformation due to the backside contamination;

FIG. 3 is a graph of correlation between height of contamination on a semiconductor wafer backside to resulting defocus on the wafer surface with respect to a semiconductor photolithography processing system;

FIG. 4 is a block diagram representation of a photolithography system for a semiconductor wafer as an exemplary semiconductor wafer processing device in which the subject invention may be embodied;

FIG. 5 is an enlarged cross-sectional view of a wafer chuck assembly in accordance with the principles of the present invention;

FIG. 6 is an enlarged cross-sectional view of a wafer chuck assembly in accordance with the present principles depicting compensation for a contamination particle; and FIG. 7 is a flowchart of an exemplary manner of operation of the subject invention.

Corresponding reference characters indicate corresponding parts throughout the several views unless specified otherwise.

DESCRIPTION OF THE PREFERRED EMBODIMENT(S)

With reference now to FIG. 4, there is depicted a block diagram representation of an exemplary photolithography system for processing a semiconductor wafer, generally designated 40, that may utilize the present invention. It should be appreciated that the photolithography system 40 is representative of various semiconductor processing tools or devices that may utilize the present invention. Thus, while the present invention will be described in conjunction with a photolithography system, it should be understood that the present invention is applicable to other semiconductor wafer processing tools and/or devices.

As shown herein, the system 40 is a photolithography system for the photolithography processing of a semiconductor wafer (wafer) 42. The photolithography system 40 is composed of a photolithography tool 44 used for forming a layer of photoresist (not shown) as is known in the art on the wafer 42, an automatic process controller 48, and a stepper 46 for controllably exposing the layer of photoresist on the wafer 42 to a light source (not shown). The controller 48 may take a variety of forms. For example, the controller 48 may be included within the stepper 46 or it may be a separate device (as shown) that is electrically coupled (as designated by the double-headed arrow) to the stepper 46. In the present embodiment, the controller 48 takes the form of a computer or processor driven device that is controlled by a variety of software programs such as is known in the art. Alternatively, the controller 48 may relay on a hardware controller rather than a software driven controller. Moreover, the controller 48 may not be directly coupled to the stepper 46, but rather could be coupled to and involved in controlling or collecting data from the photolithography tool 44 or other devices involved in the manufacture or processing of semiconductor devices.

The stepper 46 may be any of a wide variety of devices used to expose the layer of photoresist on the wafer 42 to a light source. The stepper 46 includes a variety of operational components. One of the operational components is a wafer chuck assembly or mechanism.

Referring now to FIG. 5, there is depicted an exemplary embodiment of a wafer chuck assembly, generally designated 50, in accordance with the principles of the present invention that is used in the stepper 46. Consistent with the above, it should be appreciated that the wafer chuck assembly 50 may be used with other semiconductor processing tools/devices other than a stepper or photolithography device. The wafer chuck assembly 50 includes a wafer chuck, chuck body or the like (collectively, wafer chuck) 52 that is manufactured from an appropriate material such as is known in the art. The wafer chuck 52 is typically annular in shape to accommodate an annular semiconductor wafer 54, but not necessarily. The wafer chuck 52 may take on various shapes while still utilizing the present principles.

The wafer chuck assembly 50 includes a shield ring 60 that is disposed on an outer annular periphery of an upper surface 53 of the wafer chuck 52. The shield ring 60 extends axially upwardly from the wafer chuck 52 and is adapted, operative and/or configured to abut an annular portion of the backside 58 of the wafer 54 and, particularly, proximate the edge thereof. The shield ring 60 is fixed in position (i.e. in height and radial position) on the wafer chuck 52 and thus provides a seat for the semiconductor wafer 20. Additionally, the shield ring 60 provides a seal between the backside 58 of the wafer 54 and radially or laterally thereof with respect to a vacuum, suction, or air exhaustion pulled through the wafer chuck 52.

The wafer chuck 52 also has a plurality of air suction, vacuum, evacuation or exhaustion bores (collectively, air suction bores) 68 of which only three (3) such air suction bores are shown. Each air suction bore 68 is configured, adapted and/or operative to be in communication with (coupled or connected to) an air suction, vacuum, air exhaustion or air evacuation device or source, collectively termed air suction source or device (not shown). Air suction from the suction source (represented by the arrow emanating from a respective bore 68) creates an air suction or pulling force within the bores 68 that is maintained on the wafer 54 from the backside 58 thereof. Each bore 68 preferably provides communication between a top surface 53 and a bottom surface 55 of the wafer chuck 52. This air suction against the backside 58 of the wafer 54 (between the backside 58 of the wafer 54 and the upper surface 53 of the chuck 52) holds the semiconductor wafer 20 down and provides a relatively flat or planar top surface 56 to the wafer 54.

In accordance with the principles of the subject invention, the wafer chuck 52 has a plurality of pin bores 62 of which only several pin bores are shown. A pin 64 is disposed in each pin bore 62. Each pin 64 is axially movable within its respective pin bore. Particularly, each pin 64 is axially upwardly movable toward the backside 58 of the wafer 54 in order to abut or contact the backside 58. Each wafer pin 64 is also axially downwardly movable with respect to the backside 58 of the wafer 54.

In one form as shown, each wafer pin bore 62 is open to the upper surface 53 of the wafer chuck 52, but includes a stop surface 63 therein that is here depicted as a ledge, protrusion, or the like. Other forms of stop surfaces may be used. The stop surface 62 limits the axially downwardly travel of the wafer pin 64. Particularly, each pin 64 includes a flared skirt 66 or the like that seats on the stop surface 62 in a rest state, when forced axially downwardly because of registration with backside contamination on the wafer, or otherwise. The skirt 66 is preferably sized to be slightly less that the size of the bore 62. This allows the applied suction to axially upwardly move the pins 64 until the top of the pins abuts or contact the backside 58 of the wafer 54 (as depicted in FIG. 5 and represented by the upward pointing arrows axially below each wafer pin/wafer pin bore). Alternatively or in addition to axial pin movement caused by suction, an amount of air pressure may be applied to the underside of the skirt 66 of each pin 64 to axially upwardly move the wafer pin. The air pressure would be supplied from an air supply (not shown) to each pin bore. The amount of air pressure provided to each pin 64 is optimized in accordance with the level of suction pulling on the semiconductor wafer 54. Since the suction pressure helps maintain the semiconductor wafer 54 onto the pins 64, the level of air pressure exerted onto the pins 64 should not overcome the air suction. In the ideal case, the air pressure is slightly less than the air suction. This provides the semiconductor wafer with a good seating surface against the pins in order to provide a planar top surface to the wafer, while maintaining the wafer onto the chuck assembly.

It should be understood from the above that the wafer chuck assembly 50 has height adjustable wafer retention pins. The pins thus adjust or compensate in height when registered with wafer backside (bottom surface) contamination in order to relieve hot spot and to maintain a relatively flat or planar upper or top surface (i.e. the processing side) of the semiconductor wafer. Each pin 64 is thus independently axially movable within its respective bore 62. Equal air pressure is thus preferably maintained on each pin. Placement of the pins 64 on the wafer chuck 52 may be done in accordance to current pin placement. Other patterns or layouts may also be used.

It should be appreciated that other manners of providing height adjustable or height compensating pins on the wafer chuck. In one alternative manner, each pin bore includes a biasing member such as a spring. The respective pin is operatively coupled to the biasing member. Each biasing member normally biases its pin axially upwardly. Of course, each pin, bore or pin/bore combination would have an upper stop to prevent the pin from being biased out of its bore. Each biasing member allows each pin to axially downwardly move when a semiconductor wafer is disposed thereon and air suction is applied, but maintain pressure against the backside thereof to provide the relatively planar top surface to the semiconductor wafer. Any pin that would register with contamination would be further axially downwardly pushed, thereby maintaining the relatively planar top surface to the semiconductor wafer. Of course, other schemes may be used and are contemplated.

While the bottom of each pin bore 62 is open to the bottom 55 of the wafer chuck 52, in another form (not shown), the bottom of each wafer pin bore 62 may be closed. In this case air suction applied to the space between the wafer chuck 52 and the wafer 54 would cause the axially upward movement of the pins 64. Other manners of biasing the wafer pins, such as springs or the like, are also contemplated. The pins 64 are axially upwardly movable to register with the backside 58 of the wafer 54 at essentially the same height as the height of the shield ring 60.

It should be appreciated that the depiction in FIG. 5 shows a semiconductor 54 that is free from backside contamination or a case in which none of the pins 64 register with any backside contamination.

In FIG. 6 there is depicted a case where at least one particle, point or area of contamination 70 does register with a pin 64, the registered pin being designated 64*a*. Particularly, when the pin 64*a* is caused to axially upwardly travel toward the backside 58 of the wafer 54 (such as via applied air pressure to the bottom portion of the skirt 66*a* and/or a vacuum applied to the upper portion of the skirt 66*a* via the pin bore 62*a*, or by a biasing member or the like), the pin 64 contacts the area of contamination 70. The pin 64*a* thus does not axially upwardly travel as far as the other pins 64 (or alternatively, travels further axially downwardly). This prevents topside 56 topology (bumps and/or bulges) from occurring to the semiconductor wafer 54, and thus maintains the top surface 56 of the semiconductor wafer 54 relatively planar.

Of course, it should be appreciated that all of the other pins 64 operative in the same manner as pin 64*a* when a pin registers with backside contamination. It should be appreciated that each pin is axially movable up and down within and with respect to the wafer chuck 52. Air pressure or another manner of axial biasing is preferably, but not necessarily provided, in order to push the pins axially upward toward the backside of the wafer, in addition to the air suction occurring via the suction bores 68. The air pressure and as well the air suction are controlled via the controller 48 (see FIG. 4) such that there is an optimization between the force of the vacuum pressure and the force of the air pressure. As shown in the graph of FIG. 3, the amount of defocus resulting from the height of backside contamination is not one to one linear. This is true because the backside of the wafer has a certain amount of roughness.

Referring now to FIG. 7, there is depicted a flowchart, generally designated 80, illustrating an exemplary manner of operation of the exemplary embodiment of the subject invention. In block or step 82 a semiconductor wafer is placed onto a wafer chuck having height adjustable or compensatable wafer support pins (and, preferably but not necessarily, a retaining or shield ring), the wafer chuck associated with a semiconductor processing device or tool. In block or step 84, a biasing force (such as air pressure or via a biasing member) is applied to the height adjustable wafer support pins each one of which is disposed in a wafer support pin bore in the wafer chuck. The biasing force axially upwardly moves each wafer support pin into contact with the backside of the semiconductor wafer or contamination on the backside of the semiconductor wafer.

In block or step 86, air suction is applied via air suction bores in the wafer chuck to an area between the backside of the semiconductor wafer and the upper surface of the wafer chuck. This pulls the backside (or backside with contamination) of the semiconductor wafer downwardly towards the wafer chuck and the top of each wafer support pin. Thereafter, in block or step 88, processing of the semiconductor wafer proceeds.

It should be appreciated that the above manner of operation may include more or less steps than those illustrated. Additional steps may take place between the illustrated steps. Moreover, the sequence of steps may be different than that illustrated.

While this invention has been described as having a preferred design and/or configuration, the subject invention can be further modified within the spirit and scope of this disclosure. This application is therefore intended to cover any variations, uses, or adaptations of the invention using its general principles. Further, this application is intended to cover such departures from the subject disclosure as come within known or customary practice in the art to which this invention pertains and which fall within the limits of the appended claims.

What is claimed is:

1. In a semiconductor wafer processing device, a method of retaining a semiconductor wafer for processing, comprising:

placing a semiconductor wafer onto a wafer chuck having height adjustable wafer support pins and a shield ring;

applying a biasing force to each wafer support pin while maintaining the semiconductor wafer on the chuck; and applying suction to a backside of the semiconductor wafer while maintaining the semiconductor wafer on the chuck.

2. The method of claim 1, wherein applying a biasing force to each wafer support pin includes applying a biasing force comprising air pressure to each wafer support pin.

3. The method of claim 1, wherein applying suction to a backside of the semiconductor wafer includes applying suction to a suction port in the wafer chuck, the suction port providing communication from an upper surface of the wafer chuck adjacent the backside of the semiconductor wafer to an outside area of the wafer chuck.

4. The method of claim 1, wherein placing a semiconductor wafer onto a wafer chuck having height adjustable wafer support pins and a shield ring comprises placing a semiconductor wafer onto a wafer chuck having a plurality of pin bores each one of which has an axially movable support pin therein.

5. The method of claim 4, wherein applying a biasing force to each wafer support pin includes applying a biasing force comprising air pressure to each pin bore.

6. The method of claim 5, wherein applying a biasing force comprising air pressure to each pin bore comprises applying equal air pressure to each pin bore.

* * * * *